(12) United States Patent
Grise et al.

(10) Patent No.: US 7,685,542 B2
(45) Date of Patent: Mar. 23, 2010

(54) METHOD AND APPARATUS FOR SHUTTING OFF DATA CAPTURE ACROSS ASYNCHRONOUS CLOCK DOMAINS DURING AT-SPEED TESTING

(75) Inventors: Gary D. Grise, Colchester, VT (US); Vikram Iyengar, South Burlington, VT (US); Mark R. Taylor, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 11/672,973

(22) Filed: Feb. 9, 2007

(65) Prior Publication Data

US 2008/0195905 A1 Aug. 14, 2008

(51) Int. Cl.
*G06F 17/50* (2006.01)
*G01R 31/28* (2006.01)
*G01R 31/02* (2006.01)
*G06F 11/00* (2006.01)

(52) U.S. Cl. .................. 716/4; 716/9; 716/10; 703/14; 324/528; 324/750; 324/755; 714/30; 714/32; 714/33; 714/37; 714/726; 714/741

(58) Field of Classification Search .............. 716/4, 716/9, 10; 703/14; 324/528, 750, 755; 714/30, 714/32, 33, 37, 726, 733, 741; 702/59, 117
See application file for complete search history.

(56) References Cited

U.S. PATENT DOCUMENTS

| 4,908,842 | A | 3/1990 | Collins |
| 5,623,503 | A * | 4/1997 | Rutkowski ............ 714/727 |
| 6,115,827 | A | 9/2000 | Nadeau-Dostie et al. |
| 6,201,832 | B1 | 3/2001 | Choi |
| 6,359,946 | B1 | 3/2002 | Ryan |
| 6,414,903 | B1 | 7/2002 | Keeth et al. |
| 6,661,859 | B1 | 12/2003 | Wu |
| 6,842,398 | B2 | 1/2005 | Johnson et al. |
| 6,920,578 | B1 | 7/2005 | Thompson et al. |
| 7,478,011 | B2 * | 1/2009 | Gebara et al. ............ 702/176 |
| 2004/0085085 | A1 * | 5/2004 | Muhtaroglu et al. ...... 324/765 |

(Continued)

OTHER PUBLICATIONS

Kapoor, "Formal Modelling and Verification of an Asynchronous DLX Pipeline", Fourth IEEE International Software Engineering and Formal Methods, Sep. 11-15, 2006, pp. 118-127.*

(Continued)

*Primary Examiner*—Phallaka Kik
(74) *Attorney, Agent, or Firm*—Cantor Colburn LLP; Michael LeStrange

(57) ABSTRACT

A method for testing logic devices configured across asynchronous clock domains includes deactivating, during at-speed fault testing, a local clock signal for each of a first plurality of latches having at least one data input thereto originating from a source located within an asynchronous clock domain with respect thereto. The deactivation of a local clock signal for each of the plurality of latches is implemented in a manner so as to permit data capture within the first plurality of latches, and wherein the deactivation of a local clock signal for each of the plurality of latches is further implemented in a manner so as to permit at-speed data launch therefrom to downstream latches with respect thereto during at-speed testing.

15 Claims, 9 Drawing Sheets

U.S. PATENT DOCUMENTS

2004/0153926 A1* 8/2004 Abdel-Hafez et al. ....... 714/726
2008/0147340 A1* 6/2008 Gebara et al. ................. 702/69

OTHER PUBLICATIONS

E. Haioun et al.; "At-Speed Scan Transition and Path Delay Testing Using On-Chip PLL for High Frequency Device and Low Frequency Tester;" Euro DesignCon 2005, 23 pages.

"Wrapper Cell for Asyncronous Domain Crossings in At-Speed Structured Test;" Nov. 17, 2005, 3 pages.

B. Konemann et al.; "Delay Test: The Next Frontier of LSSD Test Systems;" International Test Conference 1992, IEEE 1992; pp. 578-587.

JJ Ruedinger; "Alternative Implementation for Phase Buffer in Quasi-Synchronous Interface;" TDB v 36 n2 Feb. 1993; pp. 319-324, Feb. 1993.

* cited by examiner

METHOD AND APPARATUS FOR SHUTTING OFF DATA CAPTURE ACROSS ASYNCHRONOUS CLOCK DOMAINS DURING AT-SPEED TESTING

BACKGROUND

The present invention relates generally to integrated circuit testing techniques and, more particularly, to a method and apparatus for shutting off data capture across asynchronous clock domains during at-speed testing.

The testing of integrated circuits has evolved into a highly developed area of technology. Generally such testing may be implemented through the use of external equipment, Built-In Self-Test (BIST) circuitry, or a combination of the two. Typically, all test methodologies involve shifting data into scannable memory elements of an integrated circuit device (e.g., Level Sensitive Scan Design or LSSD latches), capturing the input to the memory elements, shifting the captured data out and then comparing the captured data with predetermined values to determine whether the circuit has performed according to design. Automatic test pattern generation (ATPG) systems use tools for testing digital circuits after the circuits have been manufactured. In general, an ATPG tool generates a set of test vectors that are applied to a circuit under test. The output of the circuit is analyzed to identify logic faults in the circuit design (i.e., "functional testing"), as well as detecting fabrication defects (i.e., "structural testing").

"At-speed" testing refers to testing techniques to detect defects that are only apparent when the circuit is running at system speed. Many time-based defects cannot be detected unless the circuit is run at-speed. Examples of time related defects that occur at-speed include high impedance shorts, in-line resistance, and cross talk between signals. One problem of particular concern in regard to at-speed structural testing (ASST) relates to the effects of clock skew (i.e., misalignment of clock signals between clock domains) when signals are exchanged between different clock domains in the circuit at high test-clock speeds. The testing of multiple asynchronous clock domains simultaneously while using functional clocks generated by phase locked loops (PLLs) is difficult because it is impossible to predict the relative positions of clock edges generated by asynchronous PLLs. Existing solutions to the problem of testing multiple asynchronous clock domains include testing only one clock domain at a time, and/or inserting a wrapper of latches or flip-flops between clock domains, and/or ensuring that for each scan chain, all the latches belong to the same clock domain. Thus, only a few scan chains have test data for each test pattern shifted therein. The test still addresses only one domain at a time; however the total time required for scan is now reduced. Unfortunately, such approaches are disadvantageous in that they result in increased test data volume, increased testing time, and an increased hardware overhead.

Accordingly, it would be desirable to be able to simultaneously test the logic in asynchronous clock domains in an economical manner.

SUMMARY

The foregoing discussed drawbacks and deficiencies of the prior art are overcome or alleviated by a method for testing logic devices configured across asynchronous clock domains. In an exemplary embodiment, the method includes deactivating, during at-speed fault testing, a local clock signal for each of a first plurality of latches having at least one data input thereto originating from a source located within an asynchronous clock domain with respect thereto. The deactivation of a local clock signal for each of the plurality of latches is implemented in a manner so as to permit data capture within the first plurality of latches, and wherein the deactivation of a local clock signal for each of the plurality of latches is further implemented in a manner so as to permit at-speed data launch therefrom to downstream latches with respect thereto during at-speed testing.

In another embodiment, an apparatus for testing logic devices configured across asynchronous clock domains includes a deactivation mechanism for deactivating, during at-speed fault testing, a local clock signal for each of a first plurality of latches having at least one data input thereto originating from a source located within an asynchronous clock domain with respect thereto; wherein the deactivation mechanism is configured to permit data capture within the first plurality of latches, and wherein the deactivation mechanism is further configured to permit at-speed data launch from the first plurality of latches to downstream latches with respect thereto during at-speed testing.

In still another embodiment, a method for implementing testing of an integrated circuit device includes identifying a first plurality of latches having at least one data input thereto originating from a source located within an asynchronous clock domain with respect thereto; configuring one or more clock splitter devices associated with the first plurality of latches for selectively deactivating, during at-speed fault testing, a local clock signal associated with each of the first plurality of latches; wherein the deactivation of the local clock signal is implemented in a manner so as to permit data capture within the first plurality of latches, and wherein the deactivation of a local clock signal for each of the plurality of latches is further implemented in a manner so as to permit at-speed data launch therefrom to downstream latches with respect thereto during at-speed testing.

BRIEF DESCRIPTION OF THE DRAWINGS

Referring to the exemplary drawings wherein like elements are numbered alike in the several Figures.

DETAILED DESCRIPTION

Disclosed herein is a method and apparatus for shutting off data capture across asynchronous clock domains during at-speed testing. Briefly stated, the present disclosure introduces embodiments of a novel new clock splitter that is configured to selectively shut off asynchronous data capture during at-speed testing, through the use of a "shutoff" signal to deactivate the functional capture in latches whose data inputs are fed from other asynchronous latches in their input cone.

Figure 1:
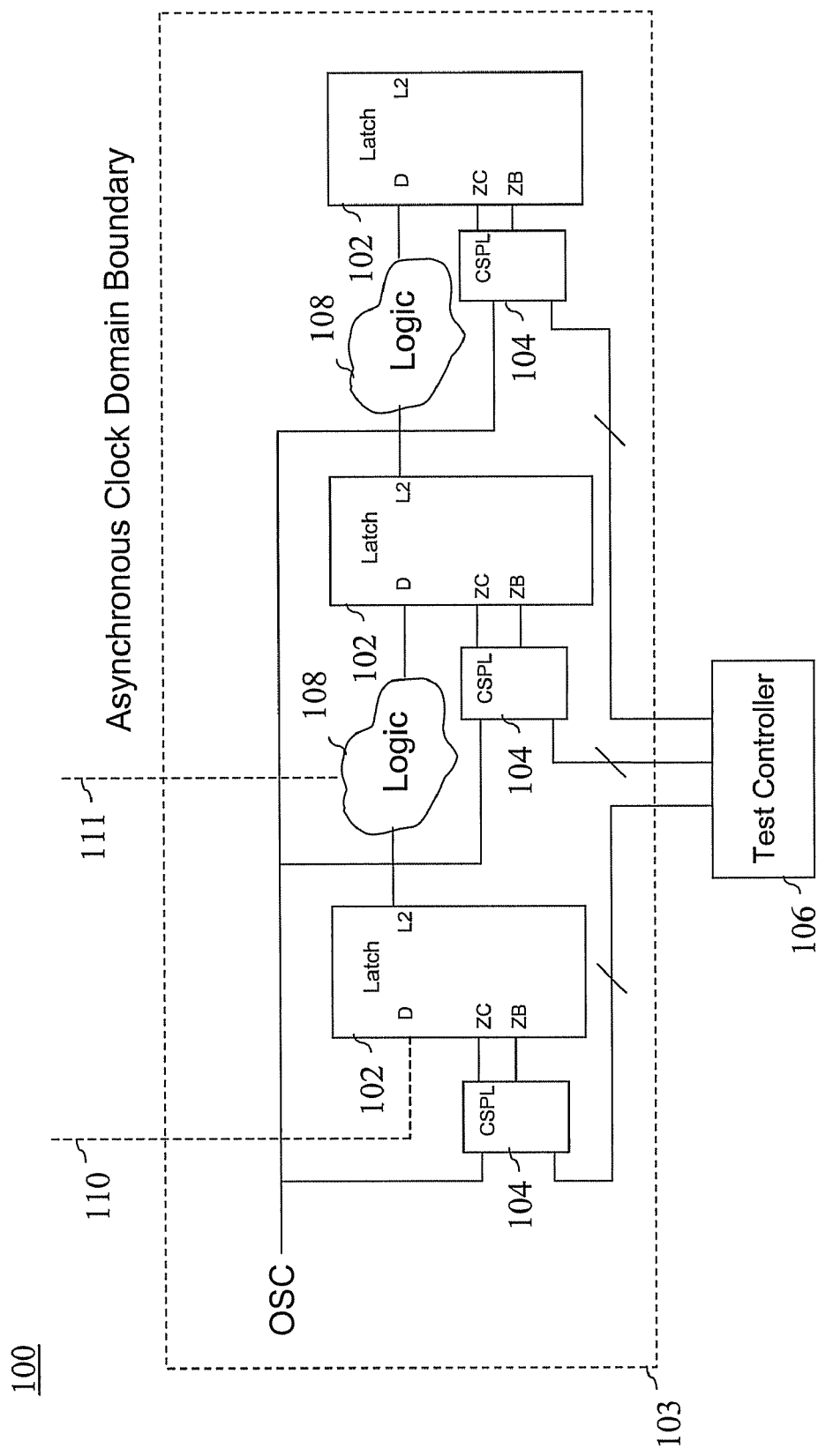
FIG. 1 is a schematic diagram of an exemplary computer circuit having a plurality of latch stages configured within a given clock domain, one or more of which has a data input originating from an asynchronous clock domain.

Referring initially to FIG. 1, is a schematic diagram of an exemplary computer circuit 100 having a plurality of latch stages 102 configured within a given clock domain 103, at least one of which has a data input (dashed line) originating from an asynchronous clock domain with respect to clock domain 103. In an exemplary embodiment, the latch stages 102 (also referred to herein simply as "latches") are configured as two-stage LSSD latches, although other configurations are possible. In addition, a plurality of individual clock splitter devices (CSPL) 104 provide local "ZB" and "ZC" clock signals to the LSSD latches 102 using the system clock (OSC) of clock domain 103 and external "B" and "C" test clock signals provided by an off-chip test controller device 106.

Although each latch stage 102 is depicted as having a separate local clock splitter device 104 associated therewith, in actuality several latches within a given domain may be coupled to a single clock splitter device. Thus, it will be understood that FIG. 1 represents a simplified example of a configuration of sequential latch stages (with combinational logic 108 therebetween). In a more representative example, an output of one latch stage could be fed to several different latches or combinational logic elements in parallel, and a latch could have several inputs coupled thereto, which may or may not be contained within the same clock domain (i.e., asynchronous inputs).

As specifically shown in FIG. 1, the dashed line 110 represents one or more inputs to a latch 102 in clock domain 103 that originates from another, asynchronous clock domain. In addition, the dashed line 111 represents one or more other inputs, from the asynchronous domain, to combinational logic 108. Thus, as will be seen, more than one latch in clock domain 103 can receive asynchronous data, and an individual latch (e.g., the middle latch 102) may receive both synchronous and asynchronous data input thereto.

Figure 2:
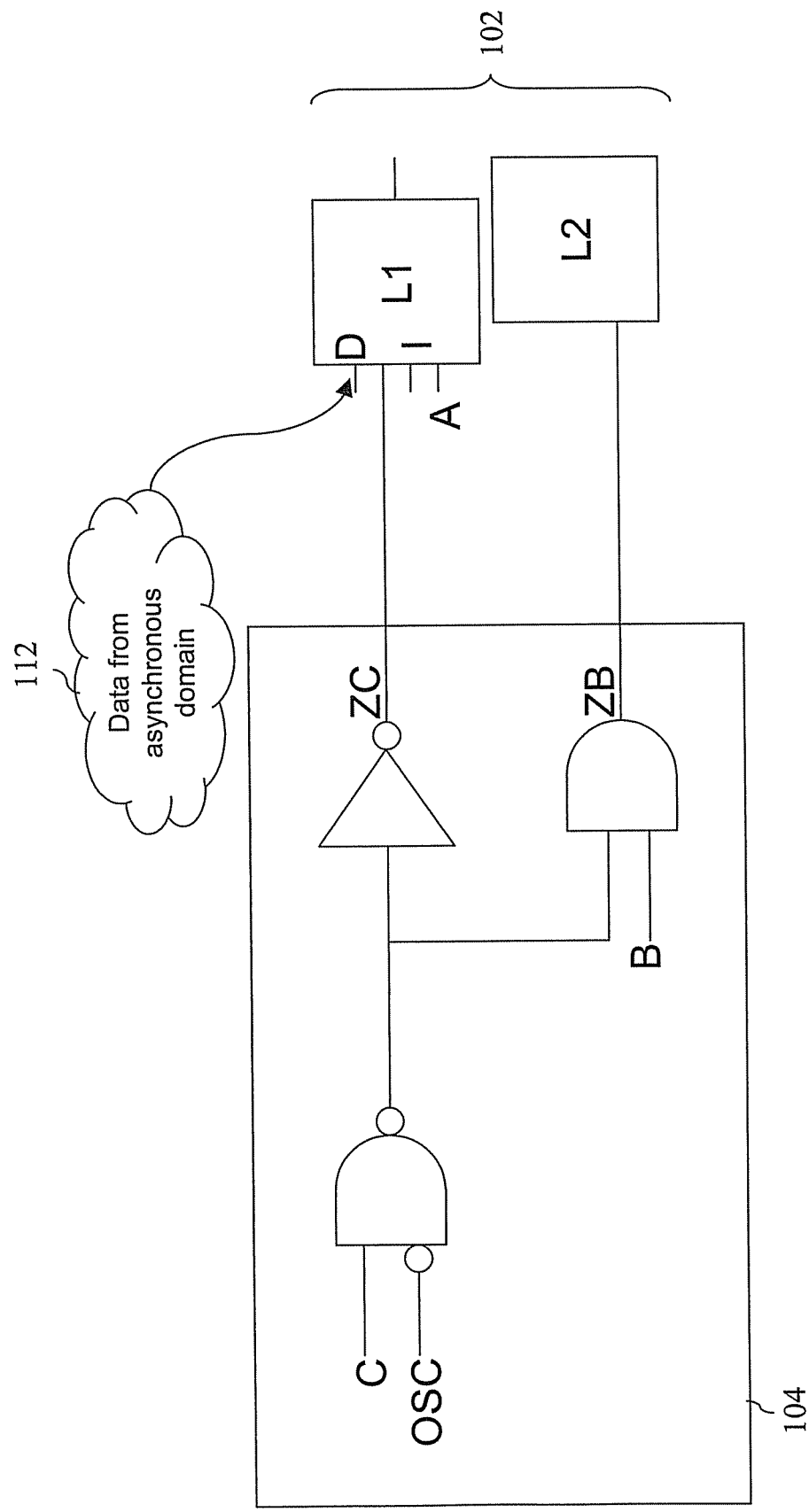
FIG. 2 is a schematic diagram of a conventional clock splitter circuit used for static (slow) and at-speed testing of integrated circuit device elements, such as those illustrated in FIG. 1.

FIG. 2 is a schematic diagram of a conventional clock splitter circuit 104 used for static (slow) and at-speed testing of integrated circuit device elements, such as those illustrated in FIG. 1. For at-speed testing, test data is first scanned into the latches 102. Two types of at-speed test are then possible. For launch-off-capture test, the L1 latch in 102 receives a slow "broadside load," i.e., a slow capture of data controlled by holding the OSC (domain system clock) signal low while the C and B test clock signals are (sequentially) activated. Alternatively, for launch-off-scan, after test data is scanned into the latches 102, a single B scan clock pulse may be applied, such that the L1 latch in 102 captures (skewed load) data from the previous latch in its scan chain. Then, for at-speed testing, system clock signal OSC is pulsed (e.g., twice) which allows launch and capture of the L1 and L2 latches at speed. However, if the input stage (L1) of a latch 102 is fed from an input across an asynchronous domain 112, there is nothing to prevent L1 from being clocked during the at-speed test. Thus, the L1 latch can capture asynchronous data that is impossible to predict at the time of test generation, and the test will fail. As indicated above, a conventional approach for at-speed testing is simply to test one domain at a time, such that the data from the asynchronous domain 112 does not transition when the input stage L1 is caused to capture at-speed.

Figure 3:
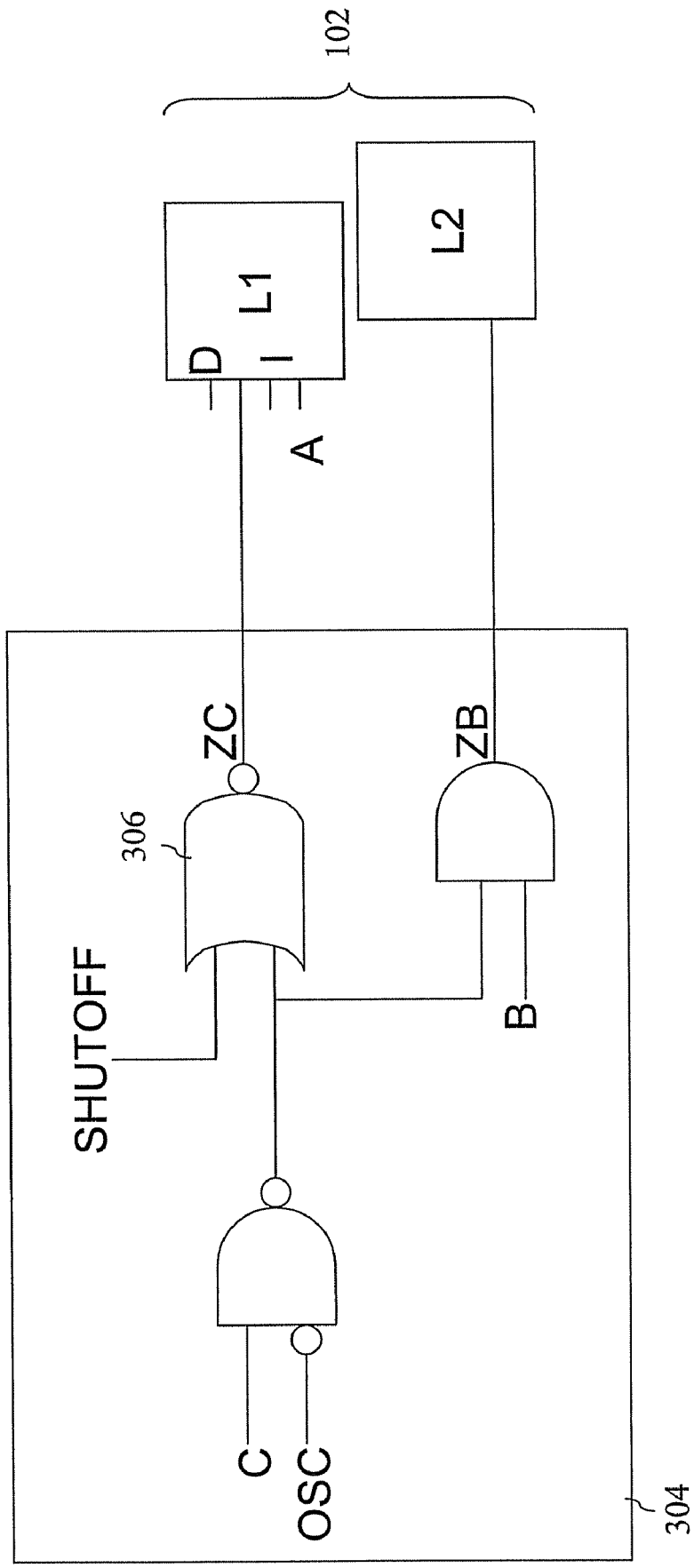
FIG. 3 is a schematic diagram of a clock splitter circuit configured for selectively shutting off data capture across asynchronous clock domains during at-speed testing, in accordance with an embodiment of the invention.

Accordingly, FIG. 3 is a schematic diagram of a clock splitter circuit 304 configured for selectively shutting off data capture across asynchronous clock domains during at-speed testing, in accordance with an embodiment of the invention. In this embodiment, a control signal "SHUTOFF" is connected to an OR gate 306 which, when deactivated reduces to the logic shown in the conventional clock splitter of FIG. 2. However, when SHUTOFF is activated (i.e., at logic high), the test clock signal ZC of the L1 latch of the latch stage 102 is tied inactive. As such, data from an asynchronous boundary in the input cone of latch stage 102 is prevented from being captured therein. However, it will also be noted that the SHUTOFF signal does not affect the operation of the local ZB clock signal to the L2 latch of the latch stage 102. In this manner, data within the latch stage 102 (e.g., following a broadside or skewed load) may still be launched from L2 into its own clock domain during at-speed testing. Thus configured, the selectable SHUTOFF signal for latch stages at asynchronous boundaries provides for both capture and launch for static fault coverage and for launch at-speed. The only loss would be the detection of dynamic faults on the inputs of such latches. These dynamic faults are not testable anyway since those paths are asynchronous.

Figure 4:
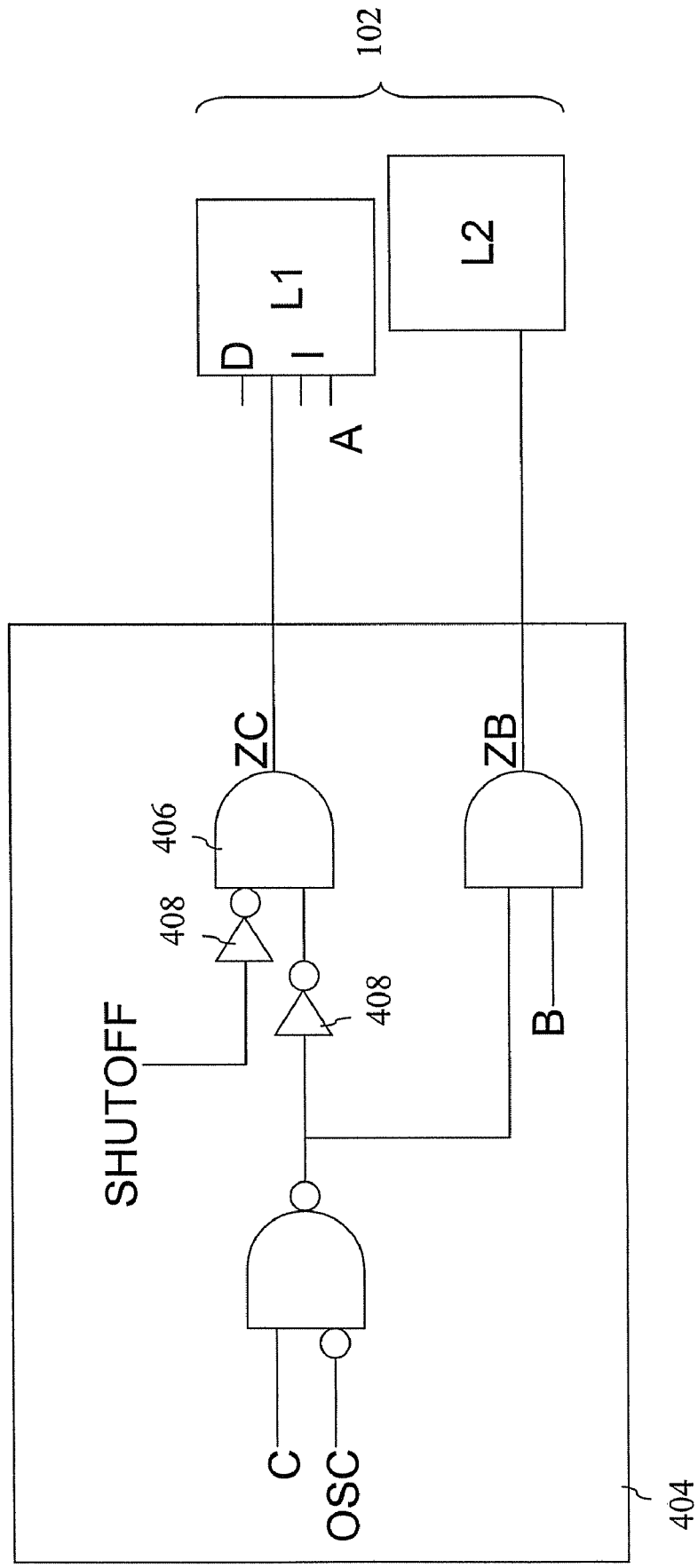
FIG. 4 is a schematic diagram of an alternative embodiment of the clock splitter circuit illustrated in FIG. 3.

It will be appreciated that other circuit topologies may be used to realize the equivalent logical function of the clock splitter circuit 304 of FIG. 3. For example, FIG. 4 is a schematic diagram of an alternative embodiment of a clock splitter circuit 404. Whereas the clock splitter 304 of FIG. 3 utilizes an OR gate 306 to generate ZC, the clock splitter 404 of FIG. 4 utilizes an AND gate 406 with the inputs thereto inverted by inverters 408.

Figure 5:
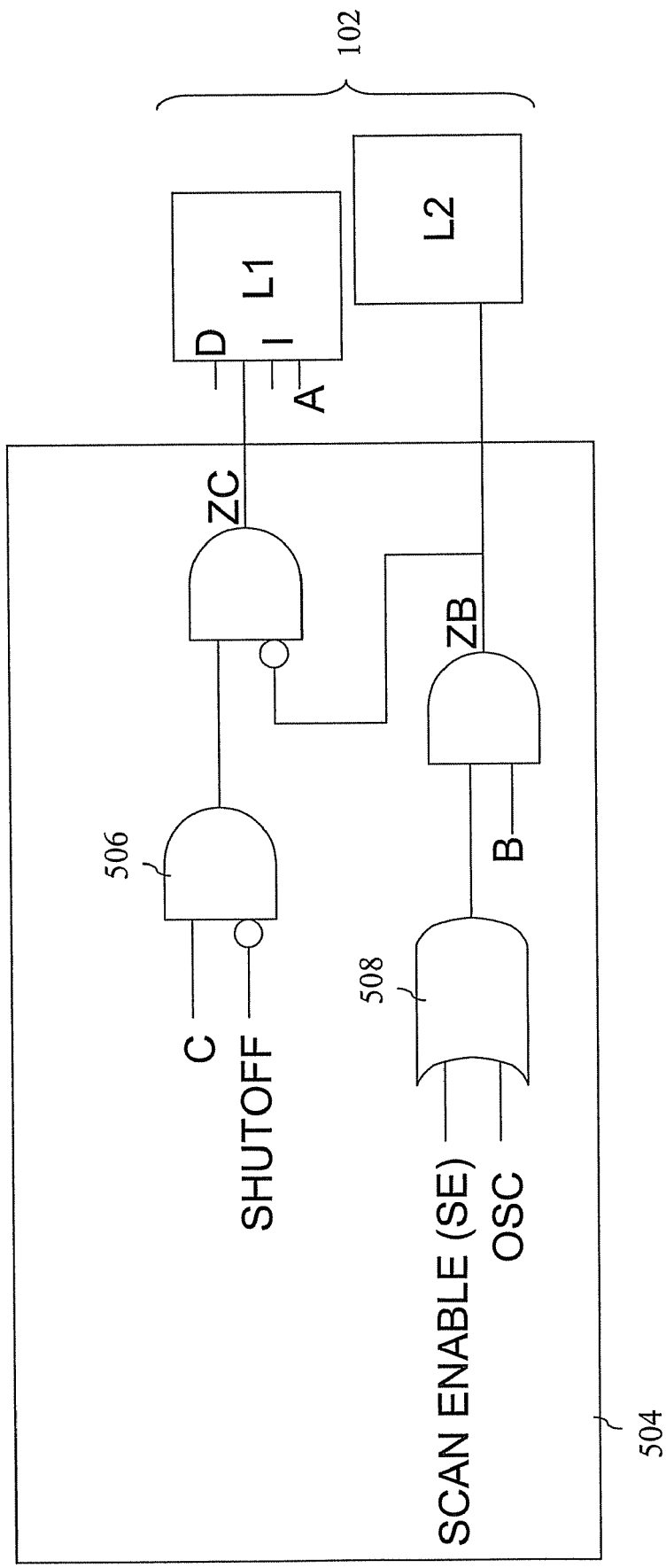
FIG. 5 is a schematic diagram of another alternative embodiment of the clock splitter circuits illustrated in FIGS. 3 and 4.

FIG. 5 is a schematic diagram of still another alternative embodiment of a clock splitter circuit 504. As will be noted, an additional clock control signal SCAN ENABLE (SE) provided by the test controller is utilized for a scan mode. The topology of clock splitter circuit 504 is somewhat different from that of circuits 304 and 404, in that the C clock and OSC inputs are provided to different logic gates: AND gate 506 and OR gate 508, respectively. In scan mode where SE is high, OSC is blocked by OR gate 508. The C clock is held low, thus the A and B clocks control the scan. In the "at-speed" mode, SE is low while the B and C clocks are held high. Thus, the OSC clock controls the latches through the ZC and ZB pins. In the "at-speed" shutoff mode, SHUTOFF goes high after the static capture in the L1s. As a result, the L2 can launch, but the L1 is shut off.

Figure 6:
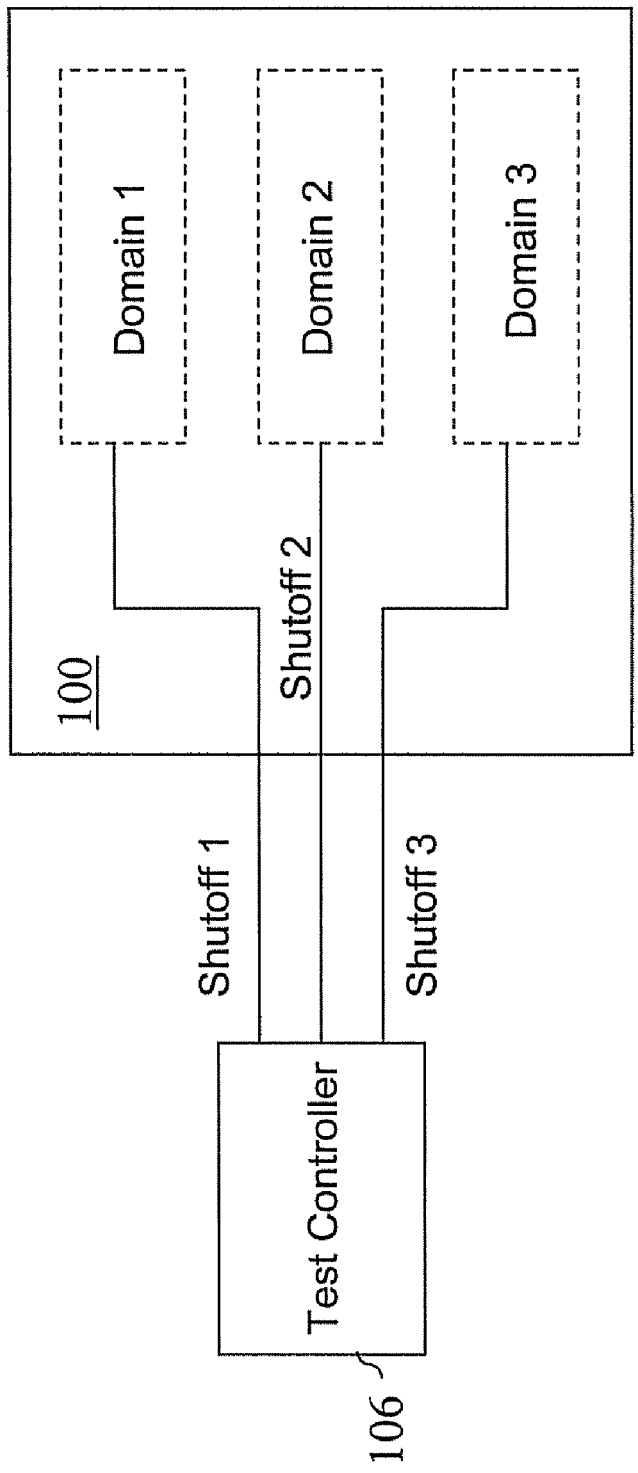
FIG. 6 is a schematic block diagram of the test controller of FIG. 1, in which the controller generates a plurality of shutoff control signals.

Although the disclosed embodiments may make use of a single, global shutoff signal, this need not necessarily be the case. For example, FIG. 6 is a schematic block diagram of the test controller 106 of FIG. 1, in which the controller 106 generates a plurality of shutoff control signals Shutoff 1, Shutoff 2, Shutoff 3, corresponding to a plurality of domains within the chip 100 (e.g., Domain 1, Domain 2, Domain 3, etc.). Thus, the controller 106 may be used to independently provide shutoff signals to selected chip domains.

Figure 7:
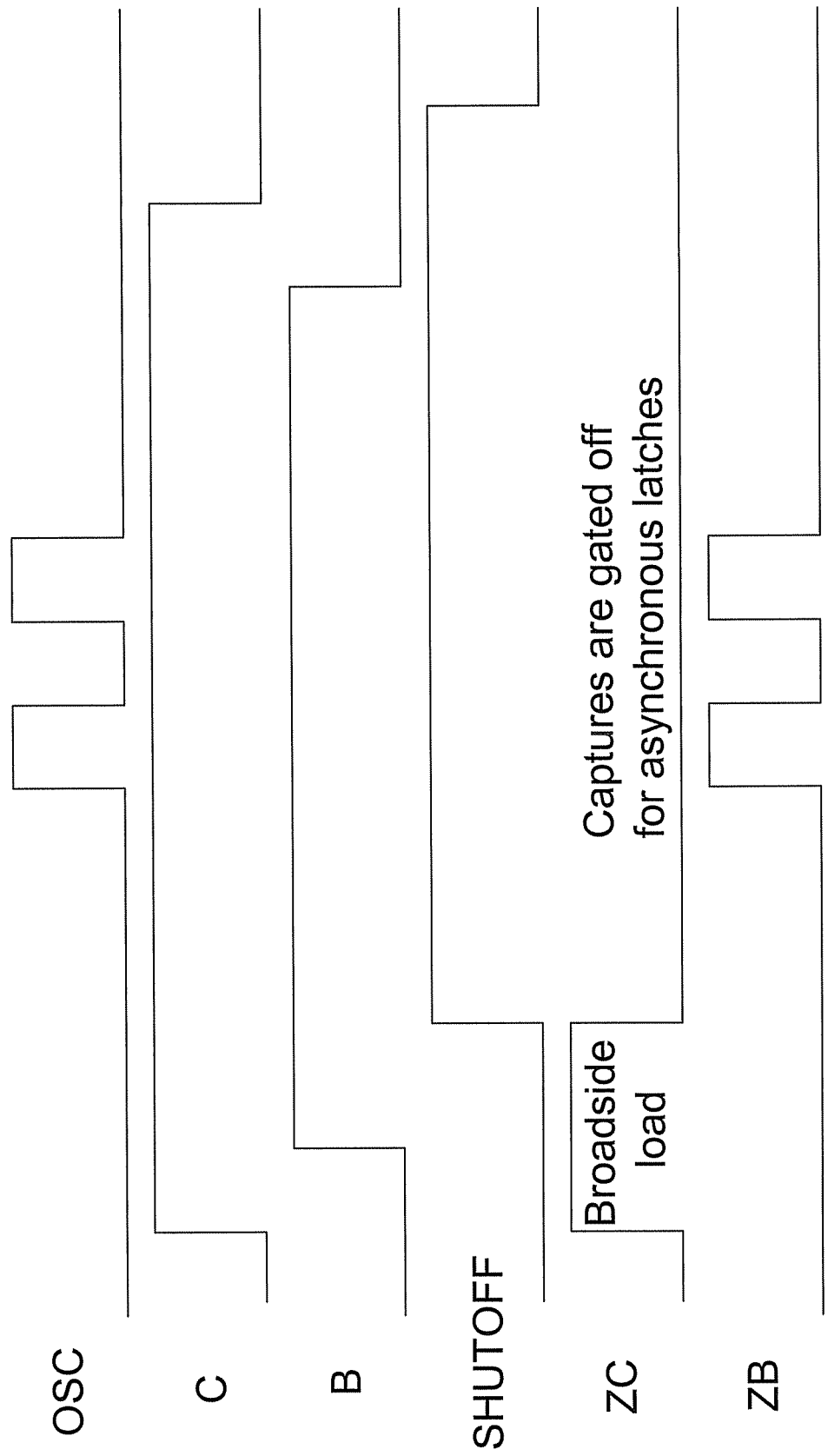
FIG. 7 is a timing diagram illustrating the operation of the shutoff function of the clock splitter embodiments during an at-speed test.

FIG. 7 is a timing diagram illustrating the operation of the shutoff function of the clock splitter embodiments during a launch-off-capture at-speed test. Prior to the activation of the SHUTOFF signal, OSC is held low, while test clock signals C and B to the local clock splitter are sequentially activated. During this time, the input latch of the stage receives the slow broadside data load. Once SHUTOFF goes from inactive low to active high, ZC is brought low, thereby preventing the input L1 latch from capturing data from across asynchronous boundaries when OSC pulses twice during at-speed testing. After the at-speed testing, the test clock signals C and B are deactivated, followed by SHUTOFF.

Figure 8:
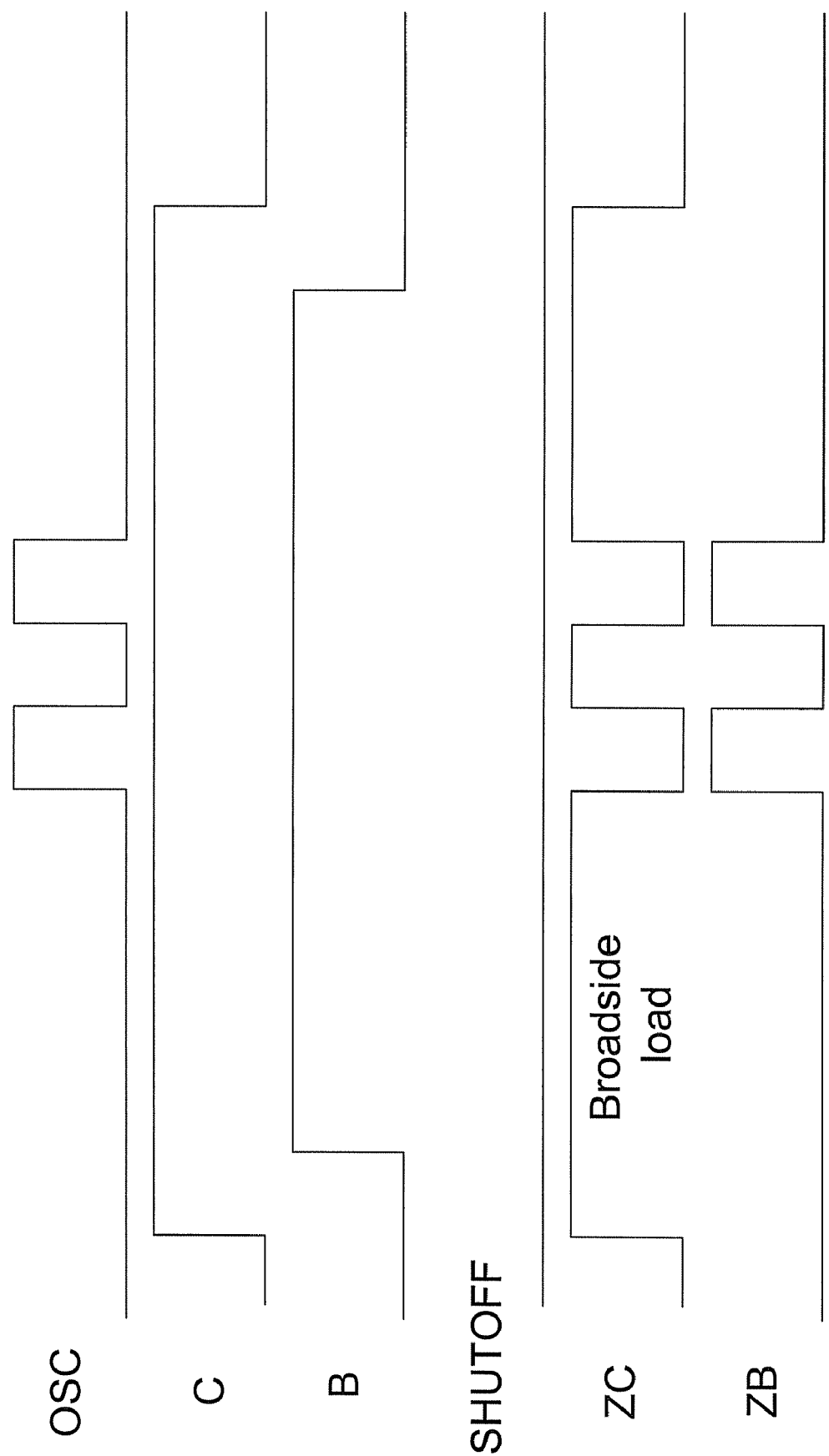
FIG. 8 is a timing diagram illustrating the disabling of the shutoff function of the clock splitter embodiments during an at-speed test within a synchronous domain.

In contrast, FIG. 8 is a timing diagram illustrating the disabling of the shutoff function of the clock splitter embodiments during an at-speed test within a synchronous domain. As can be seen, because SHUTOFF remains deactivated, ZC is not deactivated when OSC pulses twice, thus allowing at-speed data capture at the input L1 latch. This function provides additional flexibility, for example, in the event it is desired to test one domain at a time. In this mode of operation, full at-speed fault coverage is still attainable.

With regard to the design of clock splitter devices that may control latch devices that receive input data only from other latches within the same clock domain (or only from other latches within other synchronous clock domains), different configurations are contemplated. In one embodiment, each clock splitter device is configured with the same type of control logic (e.g., such as shown in any of FIGS. 3-5) regardless of the location of the latches the clock splitter controls. This approach is perhaps the simplest from a manufacturing standpoint. For those clock splitter devices that need not be used to deactivate any of its receive latches during at-speed testing, the SHUTOFF signal thereto can simply be tied inactive (e.g., to ground). In this manner, such clock splitter devices would be functionally equivalent to that shown in FIG. 2.

Alternatively, the various clock splitter devices may be designed with different logic, depending on the clock domains of the latches associated therewith. For example, clock splitter devices feeding any latches that have at least one input from across an asynchronous boundary would be designed in accordance with one of the embodiments of FIGS. 3-5, while other clock splitter devices feeding latches all receiving inputs from synchronous domains can be designed in accordance with the logic shown in FIG. 2.

Figure 9:
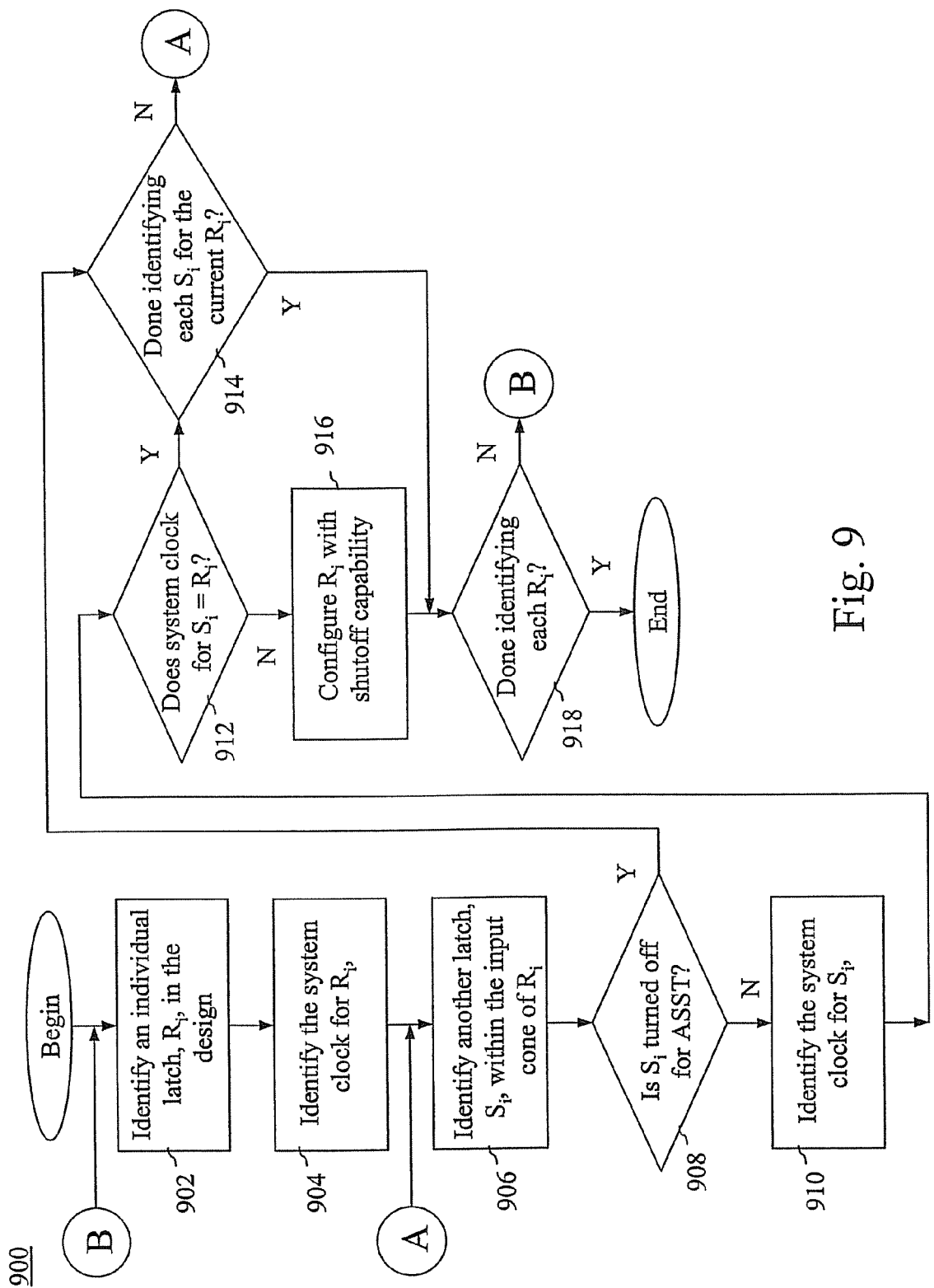
FIG. 9 is a flowchart illustrating a method of identifying integrated circuit device latches that receive data from asynchronous domains, in accordance with a further embodiment of the invention.

FIG. 9 is a flowchart illustrating a method 900 of identifying integrated circuit device latches that receive data from asynchronous domains, in accordance with a further embodiment of the invention. Once such latches are identified, the design of the associated local clock splitter can be implemented in accordance with one of the above discussed embodiments. As shown in block 902, the process begins by identifying an individual latch, $R_i$, in the circuit design that is not nominally shut off during at-speed testing. As shown in block 904, the system clock (OSC) for the identified latch, $R_i$, is determined. Then, as reflected in block 906, the input sources to the identified latch, $R_i$, are identified. More specifically, another latch, $S_i$, within the input cone of $R_i$ is identified. If at decision block 908 it is determined that $S_i$ is already nominally turned off for at-speed testing then this particular $S_i$ does not, by itself, result in a determination that the input stage of the identified $R_i$ should be deactivated. The process 900 would then feed forward as described below.

On the other hand, if the identified $S_i$ within the input cone of $R_i$ is not turned off for at-speed testing, then the system clock for $S_i$ is identified as shown at block 910. The system clock for $R_i$ is compared to the system clock for $S_i$, and if the two match as determined at decision block 912 then the currently identified $R_i$ and $S_i$ are synchronous. This is an equivalent situation to that described above, where $S_i$ is already nominally turned off for at-speed testing. In other words, this would not result in a determination that the input stage of the identified $R_i$ should be deactivated. At that point, the process would advance to decision block 914 to see whether there are additional latches in the input cone of the current $R_i$. If additional input latches are to be determined for $R_i$, then the process loops back through return node "A" to block 906 where the next $S_i$ is identified. If no additional input latches were to be determined for $R_i$, then the process 900 would then feed forward as described below.

Referring back to decision block 912, if the system clock for $R_i$ does not match the system clock for $S_i$, then the domains are asynchronous. As such, the input stage of the current $R_i$ is to be configured with shut off capability as indicated in block 816 and as described above. Moreover, no additional latches $S_i$ within the input cone of $R_i$ need be checked at this point, since it has already been determined that the current $R_i$ will be configured with shut off capability. Regardless of whether the current latch $R_i$ is designated for shut off capability or has all input latches thereto within the same clock domain or deactivated during at-speed testing, the process 900 proceeds to decision block 918 to check whether all $R_i$ latches have been identified and analyzed as described above. If so, the process 900 ends; otherwise, the process 900 loops back to through return node "B" to block 902 where the next $R_i$ is identified.

Accordingly, through the use of the above described methodology and apparatus embodiments, the logic in asynchronous clock domains may be simultaneously tested in an economical manner. In lieu of other approaches, such as inserting additional structures that would lead to increased overhead, the input latches that receive data from asynchronous domains are selectively deactivated following a scan and a broadside load (or a skewed load) into the input latches. Then, for at-speed testing, the local C (not B) clocks signal is deactivated using a new test signal (SHUTOFF) to prevent them from capturing at-speed. By activating the SHUTOFF signal after the broadside load (or skewed load) allows the input latches to capture for static fault coverage. Moreover, by still permitting the B clocks to switch at-speed allows a latch to launch at-speed transitions into their own domains.

As indicated above, it is not necessary to use the same shutoff signal for all clock domains. A different shutoff signal can be used for each clock domain or group of clock domains, such that latches that receive asynchronous data, in a combination of different clock domains, may be deactivated for each test pattern. The shutoff signal is a slow signal driven by the off-chip test controller. It is also not required to switch at-speed and therefore the shutoff does not need to be designed as a clock signal. This reduces both the design effort and design time.

Advantageously, each test pattern would test all domains, such that test coverage for the chip would rise sharply with test generation. All clock domains may be tested in the same test pattern with all local clock splitters working together off a single enable signal. Moreover, the chip pin used for the SHUTOFF signal can be shared with a scan-in or scan-out pin, since the SHUTOFF signal is not used during scan. Hence the SHUTOFF signal. Hence, there is no extra test pin overhead. Once enough patterns are generated to test all domains together, some "clean-up" test patterns may be generated for one domain at a time while keeping the SHUTOFF signal low (deactivated). This will allow identification of untested faults on paths between two latches that both belong to same domain, in case the path is gated by a signal from another domain and the receiving latch was shut off at an earlier point in time.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for testing logic devices configured across asynchronous clock domains of a computer circuit, the method comprising:
    deactivating, during at-speed fault testing, a first local clock signal for each of a plurality of latches of the computer circuit, the plurality of latches receiving at least one data input originating from an asynchronous clock domain of the computer circuit, with respect to the plurality of latches;
    wherein the deactivation of the first local clock signal for each of the plurality of latches occurs while a second local clock signal for each of the plurality of latches remains active, so as to permit data capture within the plurality of latches, and wherein the deactivation of the local clock signal for each of the plurality of latches is further implemented in a manner so as to permit at-speed data launch from the plurality of latches to downstream latches with respect to the plurality of latches during at-speed testing.

2. The method of claim 1, wherein the first local clock signal for the plurality of latches is coupled to L1 input stages of a level sensitive scan design (LSSD).

3. The method of claim 2, wherein the deactivation of the first local clock signal for each of the plurality of latches comprises enabling a control signal in communication with one or more local clock splitter devices associated with the plurality of latches, the one or more local clock splitter devices generating the first and second local clock signals.

4. The method of claim 3, wherein the second local clock signal for each of the plurality of latches is unaffected by the control signal in communication with the one or more local clock splitter devices.

5. The method of claim 4, wherein the second local clock signal for the plurality of latches is coupled to L2 output stages of the level sensitive scan design (LSSD).

6. An apparatus for testing logic devices configured across asynchronous clock domains, comprising:
    a deactivation mechanism for deactivating, during at-speed fault testing, a first local clock signal for each of a plurality of latches of a computer circuit receiving at least one data input originating from an asynchronous clock domain of the computer circuit with respect to the plurality of latches;
    wherein the deactivation mechanism is configured to allow a second local clock signal for each of the plurality of latches to remain active, so as to permit data capture within the plurality of latches, and wherein the deactivation mechanism is further configured to permit at-speed data launch from the plurality of latches to downstream latches with respect to the plurality of latches during at-speed testing.

7. The apparatus of claim 6, wherein the first local clock signal for the plurality of latches is coupled to L1 input stages of a level sensitive scan design (LSSD).

8. The apparatus of claim 7, wherein the deactivation of a the first local clock signal for each of the plurality of latches comprises enabling a shutoff control signal in communication with one or more local clock splitter devices associated with the plurality of latches, the one or more local clock splitter devices generating the first and second local clock signals.

9. The apparatus of claim 8, wherein the second local clock signal for each of the plurality of latches is unaffected by the shutoff control signal in communication with the one or more local clock splitter devices.

10. The apparatus of claim 9, wherein the second local clock signal for the plurality of latches is coupled to L2 output stages of the level sensitive scan design (LSSD).

11. The apparatus of claim 8, further comprising a test controller configured to generate the shutoff control signal.

12. The apparatus of claim 11, wherein the test controller is configured to generate a plurality of control signals, each corresponding to different clock domains.

13. The apparatus of claim 11, wherein the test controller is configured to utilize a common input pin for the shutoff control signal and one or more of a scan-in signal and a scan-out signal.

14. A method for implementing testing of an integrated circuit device, the method comprising:
    identifying a plurality of latches of a computer circuit receiving at least one data input originating from an asynchronous clock domain of the computer circuit with respect to the plurality of latches;
    configuring one or more clock splitter devices associated with the plurality of latches for selectively deactivating, during at-speed fault testing, a first local clock signal associated with each of the plurality of latches;
    wherein the deactivation of the first local clock signal occurs while a second local clock signal for each of the plurality of latches remains active, so as to permit data capture within the plurality of latches, and wherein the deactivation of the local clock signal for each of the plurality of latches is further implemented in a manner so as to permit at-speed data launch from the plurality of latches to downstream latches with respect the plurality of latches during at-speed testing.

15. The method of claim 14, wherein the identifying the plurality of latches further comprises:
    identifying each latch in the integrated circuit device not nominally turned off for at-speed testing;
    determining, for each identified latch, a set of input latches to each identified latch; and
    comparing, for each identified latch, a system clock of each identified latch with a system clock of the set of input latches thereto; and
    wherein a given latch is determined to have at least one data input originating from a source located within an asynchronous clock domain in the event that at least one system clock of the set of input latches is asynchronous with respect to the system clock of the given latch.

* * * * *